(12) United States Patent
Abe et al.

(10) Patent No.: US 8,779,378 B2
(45) Date of Patent: Jul. 15, 2014

(54) ELECTRON BEAM DETECTOR, ELECTRON BEAM PROCESSING APPARATUS, AND METHOD OF MANUFACTURING ELECTRON BEAM DETECTOR

(71) Applicant: Advantest Corporation, Tokyo (JP)

(72) Inventors: Kenji Abe, Tokyo (JP); Masaki Kurokawa, Tokyo (JP); Akiyoshi Tsuda, Tokyo (JP); Hideki Nasuno, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 13/968,022

(22) Filed: Aug. 15, 2013

(65) Prior Publication Data

US 2014/0061465 A1    Mar. 6, 2014

(30) Foreign Application Priority Data

Aug. 30, 2012    (JP) ................................. 2012-189899

(51) Int. Cl.
| | | |
|---|---|---|
| *H01J 49/00* | (2006.01) | |
| *H01J 37/244* | (2006.01) | |
| *H01J 9/00* | (2006.01) | |
| *G01N 23/00* | (2006.01) | |
| *G01N 7/00* | (2006.01) | |

(52) U.S. Cl.
CPC *H01J 37/244* (2013.01); *H01J 9/00* (2013.01)
USPC .......................................... 250/397; 250/310

(58) Field of Classification Search
CPC ................ H01J 37/244; H01J 37/3174; H01J 2237/2817; H01J 2237/24475
USPC .................................................. 250/310, 397
See application file for complete search history.

(56) References Cited

U.S. PATENT DOCUMENTS

| | | | | |
|---|---|---|---|---|
| 3,586,857 A | * | 6/1971 | Glasow et al. ............ | 250/370.01 |
| 3,896,308 A | * | 7/1975 | Venables et al. .............. | 250/305 |
| 5,093,577 A | * | 3/1992 | de Poorter et al. ............ | 250/397 |
| 5,548,121 A | * | 8/1996 | Balmer et al. ........... | 250/370.01 |
| 6,140,654 A | * | 10/2000 | Nakasugi et al. .......... | 250/491.1 |
| 6,265,812 B1 | * | 7/2001 | Watanabe et al. ...... | 313/103 CM |

(Continued)

FOREIGN PATENT DOCUMENTS

| | | |
|---|---|---|
| JP | 05-080158 | 4/1993 |
| JP | 09-293652 | 11/1997 |

(Continued)

OTHER PUBLICATIONS

Office action issued by Japanese Patent Office for the counterpart Japanese application and its English translation.

*Primary Examiner* — Jack Berman
*Assistant Examiner* — Sean Luck
(74) *Attorney, Agent, or Firm* — Muramatsu & Associates

(57) ABSTRACT

There is provided an electron beam detector including an electron beam scatterer which is disposed at a predetermined distance below a shield including a plurality of openings formed therein, and a beam detection element disposed at a predetermined distance below the scatterer and configured to convert an electron beam into an electric signal. In the electron beam detector, the scatterer is disposed at an equal distance from any of the openings in the shield, and the beam detection element is disposed at an equal distance from any of the openings in the shield. Thus, the electron beam detector can suppress a variation in detection sensitivity depending on the position of the opening.

13 Claims, 14 Drawing Sheets

(56) References Cited

U.S. PATENT DOCUMENTS

| | | | |
|---|---|---|---|
| 6,271,052 B1* | 8/2001 | Miller et al. | 438/50 |
| 6,399,945 B1* | 6/2002 | Hirayanagi | 250/310 |
| 6,462,340 B1* | 10/2002 | Inokuti | 250/310 |
| 6,462,346 B1* | 10/2002 | Kobinata | 250/492.2 |
| 7,714,300 B1* | 5/2010 | McCord et al. | 250/397 |
| 8,013,294 B2* | 9/2011 | Suyama et al. | 250/287 |
| 2002/0071996 A1* | 6/2002 | Kienzle et al. | 430/5 |
| 2002/0175283 A1* | 11/2002 | Chang et al. | 250/315.3 |
| 2004/0245465 A1* | 12/2004 | Steigerwald et al. | 250/310 |
| 2005/0230620 A1* | 10/2005 | Jacka et al. | 250/311 |
| 2006/0076491 A1* | 4/2006 | Yasuda et al. | 250/310 |
| 2010/0225221 A1* | 9/2010 | Suzuki et al. | 313/104 |
| 2010/0329429 A1* | 12/2010 | Okunuki et al. | 378/122 |
| 2011/0095178 A1* | 4/2011 | Giannakopulos et al. | 250/282 |
| 2011/0121179 A1* | 5/2011 | Liddiard et al. | 250/336.1 |
| 2011/0278451 A1* | 11/2011 | Tiemeijer et al. | 250/307 |

FOREIGN PATENT DOCUMENTS

| | | |
|---|---|---|
| JP | 10-261566 | 9/1998 |
| JP | 2001-118787 | 4/2001 |
| JP | 2004-111422 | 4/2004 |
| JP | 2006-093579 | 4/2006 |
| WO | WO 02/063662 | 8/2002 |

* cited by examiner

ELECTRON BEAM DETECTOR, ELECTRON BEAM PROCESSING APPARATUS, AND METHOD OF MANUFACTURING ELECTRON BEAM DETECTOR

CROSS-REFERENCE TO RELATED APPLICATION

This application is based upon and claims the benefit of priority of the prior Japanese Patent Application NO. 2012-189899, filed Aug. 30, 2012, the entire contents of which are incorporated herein by reference.

FIELD

The embodiments discussed herein are related to an electron beam detector and an electron beam processing apparatus which are suitable for detection of an irradiation position, a shape, a current, and other characteristics of an electron beam, and to a method of manufacturing the electron beam detector.

BACKGROUND

An electron beam processing apparatus such as an electron microscope or an electron beam exposure system requires high accuracy in electron beam control. For this reason, such an electron microscope or an electron beam exposure system is subjected to an inspection before performing observation or exposure using an electron beam as to whether an irradiation position, a shape, a current, and other characteristics of the electron beam match predetermined values. Then, the electron beam processing apparatus performs processing such as exposure or observation of a sample after undergoing adjustment of the electron beam by use of a result of the inspection.

There are known electron beam detectors for inspecting an electron beam, which are configured to detect the electron beam passed through an opening in a shield plate. Examples of such conventional technologies are disclosed by, for example, Japanese Laid-open Patent Publication No. H05-080158, Japanese Laid-open Patent Publication No. H09-293652, Japanese Laid-open Patent Publication No. 2001-118787, and Japanese Laid-open Patent Publication No. 2006-093579.

However, the conventional electron beam detectors have a problem that electron beam detection sensitivity varies largely depending on the irradiation position of an electron beam and thus the electron beam cannot be measured accurately.

SUMMARY

An object of the embodiments discussed herein are to provide an electron beam detector and an electron beam processing apparatus which are capable of preventing a variation in detection sensitivity depending on an irradiation position of an electron beam and accurately measuring a characteristic of the electron beam, and to provide a method of manufacturing the electron beam detector.

According to an aspect of the following disclosure, there is provided an electron beam detector including: a shield plate including a plurality of openings formed therein; a scatterer disposed at a predetermined distance from the shield plate and configured to scatter an electron beam passed through any of the openings of the shield plate; and a beam detection element disposed at a predetermined distance from the scatterer and configured to convert the electron beam passed through the scatterer into an electric signal.

In addition, according to another aspect of the following disclosure, there is provided an electron beam processing apparatus including: an electron beam irradiator configured to perform irradiation with an electron beam; a sample stage to mount a sample to be irradiated with the electron beam; and an electron beam detector placed on the sample stage and configured to detect a characteristic of the electron beam. In the electron beam processing apparatus, the electron beam detector includes: a shield plate including a plurality of openings formed therein; a scatterer configured to scatter an electron beam passed through any of the openings of the shield plate; and a beam detection element configured to convert the electron beam passed through the scatterer into an electric signal.

Further, according to still another aspect of the following disclosure, there is provided a method of manufacturing an electron beam detector including the steps of: preparing a support; forming an etching stopper film on the support, the etching stopper film being made of a material different from a material of the support; forming a scatterer film on the etching stopper film, the scatterer film being made of a material different from the material of the etching stopper film; forming an opening in a predetermined portion of the support by etching; and removing selectively the etching stopper film exposed through the opening of the support.

According to the electron beam detector of the above-described aspect, the scatterer is disposed at a predetermined distance from the shield plate including the plurality of openings formed therein, and the beam detection element is disposed at a predetermined distance from the scatterer.

As a consequence, the scatterer is located at an equal distance from any of the openings in the shield plate, and the beam detection element is located at an equal distance from any of the openings in the shield. Thus, it is possible to suppress a variation in detection sensitivity due to differences in the position of the opening.

Meanwhile, the electron beam processing apparatus according to the above-described aspect can accurately measure a displacement of the electron beam depending on an irradiation position thereof, and a deformation of the beam. Thus, the apparatus can perform processing such as exposure and observation at higher accuracy.

In addition, according to the method of manufacturing an electron beam detector of the above-described aspect, the etching stopper film is provided between the scatterer film which constitutes the scatterer and the support which supports the scatterer. Moreover, the openings to expose the scatterer film therethrough are formed by using the etching stopper film.

Thus, it is possible to obtain the electron beam detector which can suppress a variation in thickness of the scatterer film, suppress a variation in the scattering characteristic depending on the position, and thereby has less variation in detection sensitivity.

DESCRIPTION OF EMBODIMENTS

Figure 1:
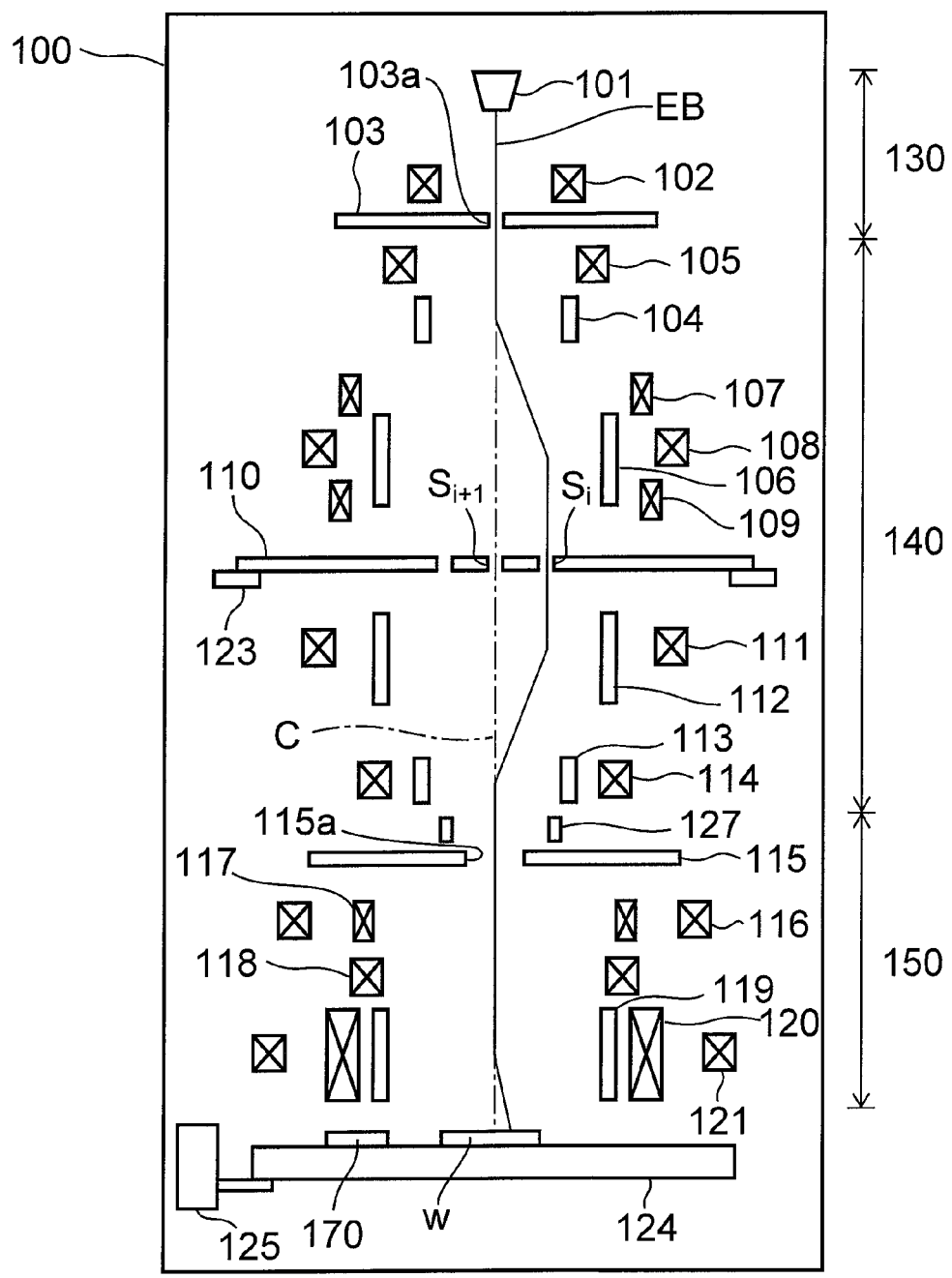
FIG. 1 is a block diagram of an electron beam exposure system.

FIG. 1 is a block diagram illustrating an electron beam exposure system.

This electron beam exposure system 100 includes an electron beam generation unit 130, a mask deflection unit 140, and a substrate deflection unit 150.

An electron gun 101 in the electron beam generation unit 130 generates an electron beam EB. The electron beam EB is converged by a first electromagnetic lens 102 and is thereby formed into the electron beam EB having a predetermined current density. Further, the converged electron beam EB is passed through a rectangular aperture 103a of a beam shaping mask 103 whereby the cross section of the electron beam EB is shaped into a rectangle, for example.

The electron beam EB thus generated by the electron beam generation unit 130 is focused on an exposure mask 110 by a second electromagnetic lens 105 of the mask deflection unit 140. Then, the electron beam EB is deflected by a first electrostatic deflector 104 and a second electrostatic deflector 106 into a specific pattern $S_i$ formed in the exposure mask 110. The electron beam EB is shaped to have a cross-sectional shape of the pattern $S_i$ by passing through the exposure mask 110.

Here, the exposure mask 110 can be moved together with a mask stage 123.

A third electromagnetic lens 108 and a fourth electromagnetic lens 111 are disposed above and below the exposure mask 110, respectively. These lenses form the image of the electron beam EB on a sample (a wafer) W.

The electron beam EB passed through the exposure mask 110 is brought back onto an optical axis C by a third electrostatic deflector 112 and a fourth electrostatic deflector 113, and is then subjected to reduction in size (the cross-sectional area) by a fifth electromagnetic lens 114.

The mask deflection unit 140 is provided with a first correction coil 107 and a second correction coil 109. Deflection aberrations of the electron beam EB caused by the first to fourth electrostatic deflectors 104, 106, 112, and 113 are corrected by the correction coils 107 and 109.

Thereafter, the electron beam EB is passed through an aperture 115a of a shield plate 115 provided in the substrate deflection unit 150, and is reduced by a predetermined reduction ratio such as 1/60 using a first electromagnetic projection lens 116 and a second electromagnetic projection lens 121. Then, the electron beam EB is deflected by a fifth electrostatic deflector 119 and an electromagnetic deflector 120, whereby a reduced image of the exposure mask 110 is projected onto a predetermined position on the sample W.

Here, deflection aberrations caused by the fifth electrostatic deflector 119 and the electromagnetic deflector 120 are corrected by a third correction coil 117 and a fourth correction coil 118 of the substrate deflection unit 150.

The sample W is fixed to a wafer stage 124 which is horizontally movable by a drive unit 125 such as a motor. Exposure can be performed on the entire surface of the sample W by moving this wafer stage 124.

In the meantime, an electron beam detector 170 is disposed on the wafer stage 124 near the position where the sample W is mounted.

Figure 2:
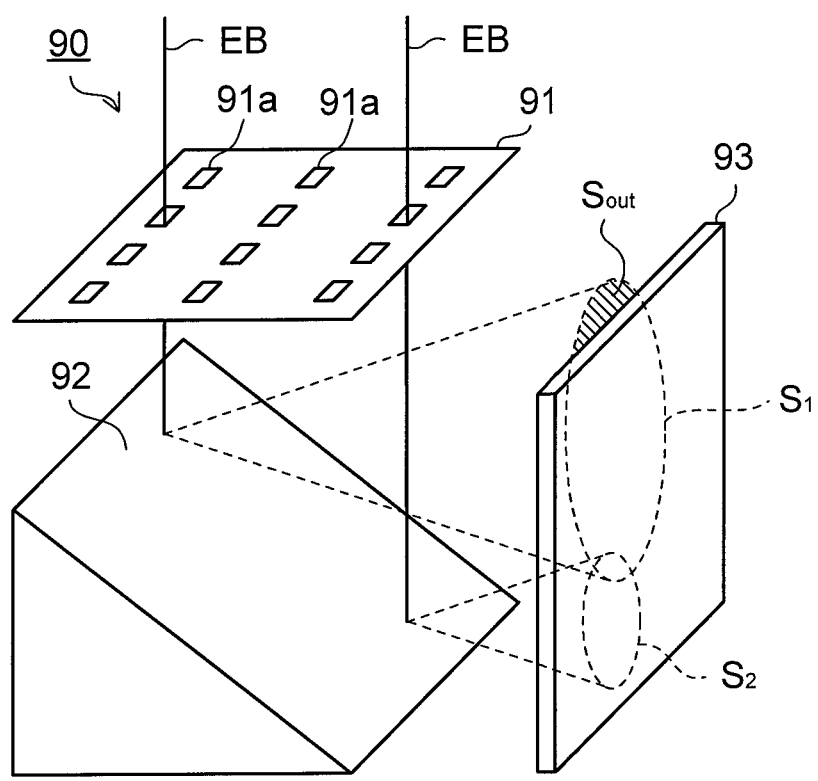
FIG. 2 is a perspective view illustrating an example of an electron beam detector used in the electron beam exposure system of FIG. 1.

FIG. 2 is a perspective view illustrating an example of an electron beam detector.

This electron beam detector 90 includes a shield plate 91 having a plurality of openings 91a. The shield plate 91 is formed into a rectangular shape with sides of several millimeters each, for instance, which is greater than a deflection range (about a 100-micrometer square, for example) of the electron beam EB by the electron beam exposure system 100. The openings 91a are arranged in the shield plate 91 at predetermined intervals so as to measure a displacement of the electron beam EB depending on an irradiation position thereof, a deformation of the beam shape, and the like. A width or length of each opening 91a ranges from several tens of nanometers to several micrometers, for example.

The electron beam EB passed through any of the openings 91a of the shield plate 91 is reflected by a reflector 92 disposed below the shield plate 91 and is detected by a beam detection element 93. The reflector 92 prevents the beam detection element 93 from heat generation and saturation of detection output therefrom.

However, the reflective electron beam detector 90 has a problem of a variation in detection sensitivity of the electron beam depending on the irradiation position of the electron beam EB.

Specifically, the electron beam EB passed through an opening 91a located near the beam detection element 93 is detected in a region $S_2$ on the beam detection element 93. On the other hand, the electron beam EB passed through another opening 91a located away from the beam detection element 93 is detected in a region $S_1$ on the beam detection element 93. As illustrated in the drawing, a portion $S_{out}$ of the electron beam passed through the opening 91a located away from the beam detection element 93 is not detected by the beam detection element 93. Thus, the detection sensitivity of the electron beam varies as a consequence.

For this reason, the electron beam detector 90 of FIG. 2 causes the variation in detection sensitivity depending on the irradiation position of the electron beam.

First Embodiment

Figure 3:
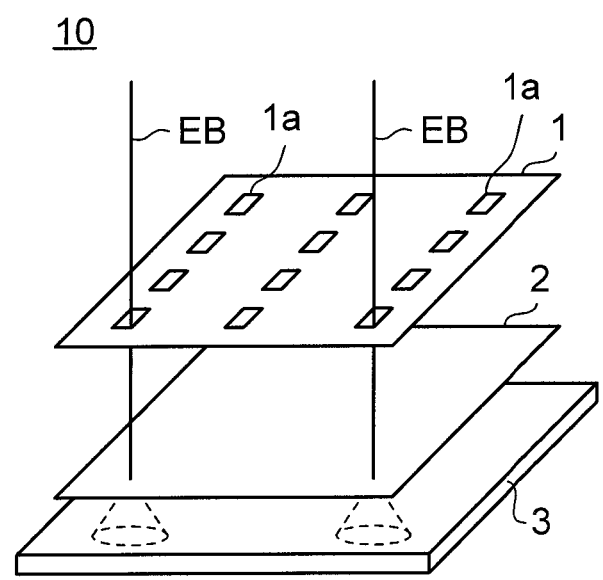
FIG. 3 is a perspective view illustrating an outline of a transmissive electron beam detector according to a first embodiment.

FIG. 3 is a perspective view illustrating an outline of an electron beam detector according to a first embodiment.

An electron beam detector 10 of this embodiment includes a shield plate 1 having a plurality of openings 1a, a scatterer 2 configured to scatter an electron beam passed through any of the openings 1a of the shield plate 1, and a beam detection element configured to detect the electron beam passed through the scatterer 2.

The scatterer 2 and the beam detection element 3 are formed substantially in the same size as the shield plate 1, and are arranged parallel to the shield plate 1. Accordingly, a distance between the scatterer 2 and the beam detection element 3 becomes always equal irrespective of the position of the opening 1a. Thus, the electron beam detector 10 can suppress a detection error due to the difference in the irradiation position of the electron beam EB, which would occur in the reflective electron beam detector 90 of FIG. 2.

Nonetheless, the thickness of the scatterer 2 has to be reduced to several micrometers in order to detect the electron beam EB with sufficient intensity. It is therefore necessary to provide a structure to support the scatterer 2 in order to realize the electron beam detector 10 of FIG. 3.

A specific configuration of the electron beam detector 10 will further be described below.

Figure 4:
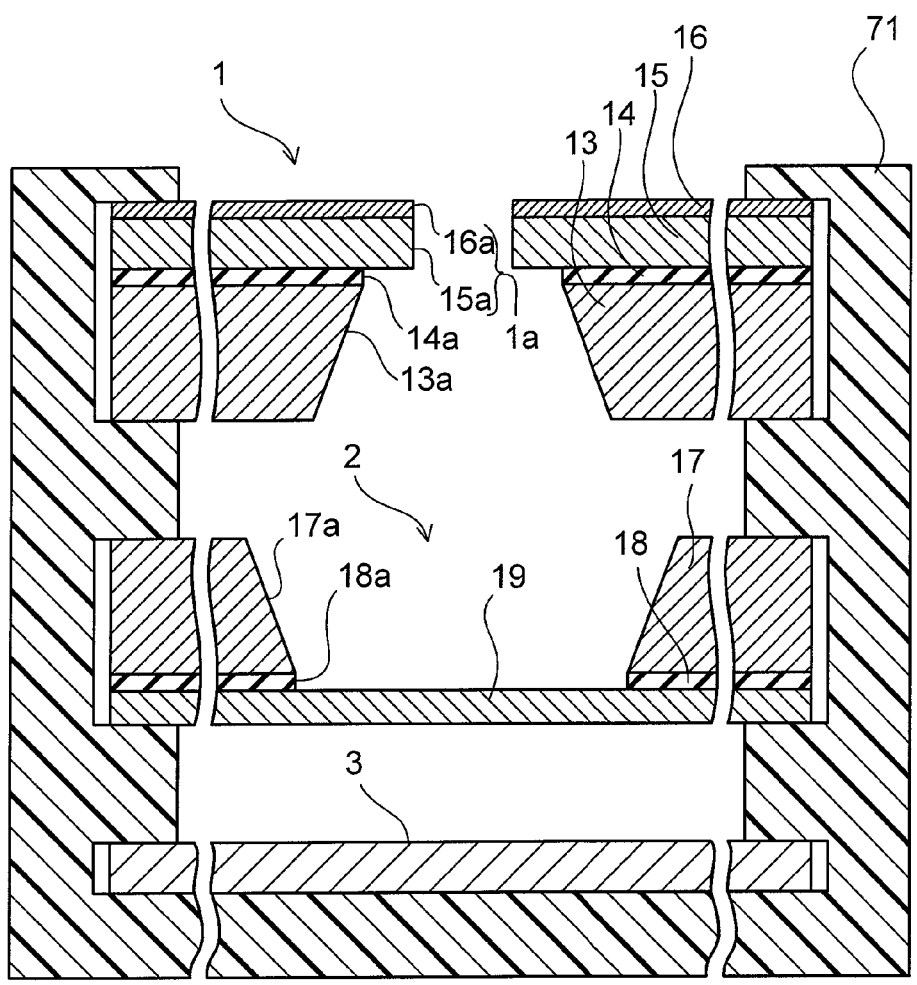
FIG. 4 is a cross-sectional view illustrating the electron beam detector according to the first embodiment.

FIG. 4 is a cross-sectional view illustrating the electron beam detector 10 of this embodiment. FIG. 4 is an enlarged view illustrating one of the openings 1a and its vicinity of the shield plate 1.

As illustrated in FIG. 4, the electron beam detector 10 includes the shield plate 1, the scatterer 2 disposed downstream of the shield plate 1, and the beam detection element 3 disposed downstream of the scatterer 2. The shield plate 1, the scatterer 2, and the beam detection element 3 are housed in a container 71.

The shield plate 1 includes a shield film 16 to shield the electron beam, and has a structure in which the shield film 16 is supported by a first support 13 and a second support 15.

The first support 13 is made of a silicon substrate having a thickness of about 1 mm, for example, which bears a large part of mechanical strength of the shield plate 1.

An etching stopper film 14 made of silicon oxide or silicon nitride having a thickness of about 1 μm, for example, is formed on the first support 13. The second support 15 made of a silicon film having a thickness of about 1 μm, for example, is formed on the etching stopper film 14.

The shield film 16 is formed on the second support 15. The shield film 16 is made of heavy metal such as platinum (Pt) having an excellent electron beam shielding performance, and an opening 16a is formed in a predetermined portion thereof. The opening 16a is formed in a varied size from several tens of nanometers to several micrometers depending on the purpose of an inspection.

The second support 15 also includes an opening 15a which is continuous with the opening 16a. These openings 15a and 16a form each opening 1a of the shield plate 1. Moreover, openings 13a and 14a having larger diameters than the opening 16a are formed at portions of the first support 13 and the etching stopper film 14 corresponding to the opening 16a of the shield film 16.

By forming the opening 13a of the first support 13 and the opening 14a of the etching stopper film 14 in the diameters greater than the opening 16a of the shield film 16 as described above, the electron beam EB passed through the opening 16a can be guided to the scatterer 2 without being attenuated.

In the meantime, the scatterer 2 has a structure in which a scatterer film 19 is supported by a support 17.

The support 17 is made of a silicon substrate, for example, and includes openings 17a formed at portions corresponding to the openings 1a of the shield plate 1. The support 17 bears a large part of mechanical strength of the scatterer 2.

An etching stopper film 18 made of silicon nitride or silicon oxide, for example, is formed on the support 17. The etching stopper film 18 is made of a material different from that of the support 17, and is configured to prevent the scatterer film 19 from being etched during formation of the openings 17a in the support 17 and thereby to prevent a variation in thickness of the scatterer film 19. Openings 18a are formed in the etching stopper film 18 by removing portions corresponding to the openings 17a of the support 17. The scatterer film 19 is exposed through the openings 18a.

The scatterer film 19 is formed on the etching stopper film 18 and is configured to scatter the electron beam passed through the opening 16a of the shield film 16 and thereby to prevent the beam detection element 3 from causing local heating or saturation of output. As for the material of the scatterer film 19, it is preferable to use a material which can bear heating by irradiation with the electron beam EB and avoid charge-up by irradiation with the electron beam EB. Specifically, a silicon film having a thickness of 2 μm, for example, or a metal film of aluminum and the like are applicable. In the meantime, the thickness of the scatterer film 19 may be appropriately determined by a simulation calculation using a Monte Carlo method based on the desired transmissivity and scattering angle of the electron beam EB.

In this embodiment, the above-described scatterer 2 is arranged in such a direction that the support 17 is located on an upstream side of the electron beam EB. Thus, the electron beam EB scattered by the scatterer film 19 is prevented from being shielded by side walls of the opening 17a of the support 17.

The beam detection element 3 is a PIN diode formed into a flat plate shape, and is arranged parallel to the scatterer film 19. As a consequence, in the electron beam detector 10, a distance between the scatterer 2 and the beam detection element 3 remains equal even when the irradiation position of the electron beam EB is changed. Thus, the electron beam detector 10 can suppress a variation in detection sensitivity depending on the irradiation position of the electron beam EB.

A method of manufacturing the electron beam detector 10 of this embodiment will be described below.

FIGS. 5A to 6D are cross-sectional views illustrating the method of manufacturing the electron beam detector 10 of FIG. 4.

First, a silicon substrate is prepared as the first support 13. Then, the silicon substrate is subjected to thermal oxidation to form the etching stopper film 14, which is made of a silicon oxide film having a thickness of about 1 m. Here, the etching stopper film 14 may use silicon nitride or the like instead. The etching stopper film 14 may be formed by a CVD instead of thermal oxidation.

Figure 5A:
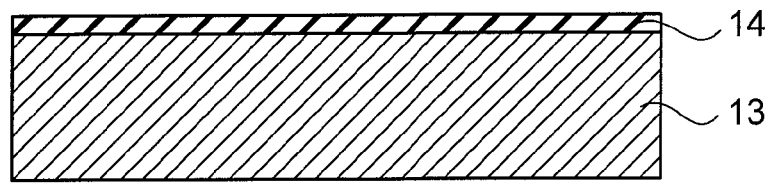
FIGS. 5A to 5D are a first group of cross-sectional views illustrating a method of manufacturing the electron beam detector of FIG. 4, which are illustrated in the order of processes.
Figure 5B:
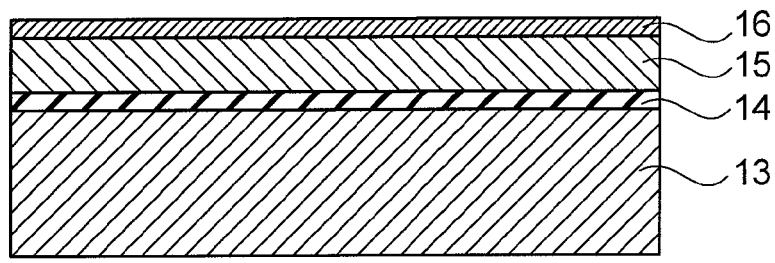

Next, as illustrated in FIG. 5B, a silicon film having a thickness of about 1 μm, for example, is formed as the second support 15 on the etching stopper film 14.

In the case of using a commercially available SOI (silicon on insulator) substrate in which a silicon oxide film and a silicon film are formed on a silicon substrate in advance, the above-described processes of forming the etching stopper film 14 and the second support 15 can be omitted.

Subsequently, a platinum (Pt) film having a thickness of several tens of nanometers, for example, is formed as the shield film 16 on the second support 15.

Figure 5C:
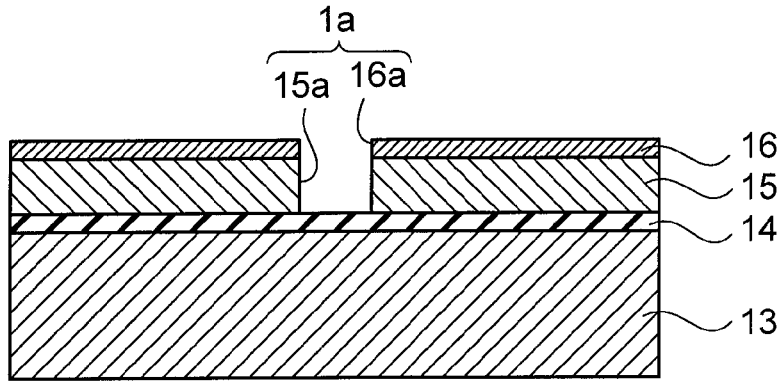

Next, a not-illustrated resist pattern is formed with a photoresist method and each opening 16a is formed in a predetermined portion of the shield film 16 as illustrated in FIG. 5C by dry etching using the resist pattern. After the resist pattern is removed, the opening 15a is formed by removing a portion of the second support 15 below the opening 16a of the shield film 16 by dry etching using the shield film 16 as a mask. Thus, formation of the opening 1a of the support 1 including the openings 15a and 16a is completed.

Figure 5D:
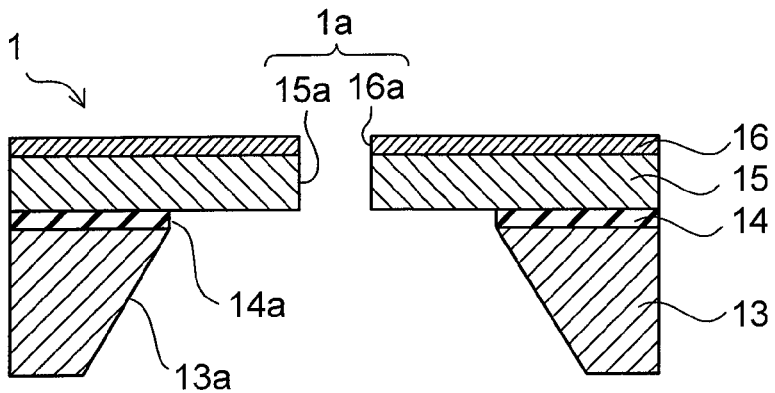

Subsequently, as illustrated in FIG. 5D, a resist pattern is formed on the back side of the first support 13 and the opening 13a is formed by removing a portion of the silicon substrate below the openings 15a and 16a by wet etching using the resist pattern as a mask. In this wet etching process, the silicon substrate is anisotropically etched by using an etchant containing KOH (potassium hydroxide) or the like, and the opening 13a including inclined side walls is formed accordingly. In this way, even when the electron beam EB spreads after being passed through the opening 1a, the electron beam EB can be guided more efficiently to the scatterer 2 while preventing the electron beam EB from being blocked by the side walls of the opening 13a.

Subsequently, the etching stopper film 14 exposed through the opening 13a of the first support 13 is selectively removed by wet etching, and the opening 14a is thereby formed in the etching stopper film 14.

Thus, formation of the shield plate 1 having the structure of FIG. 5D is finished.

Figure 6A:
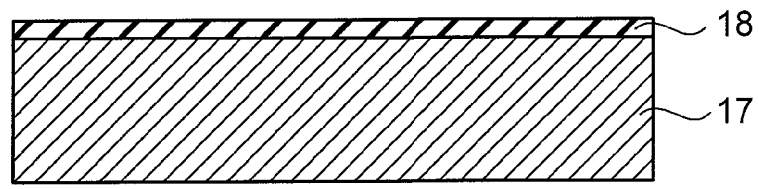
FIGS. 6A to 6D are a second group of cross-sectional views illustrating the method of manufacturing the electron beam detector of FIG. 4, which are illustrated in the order of processes.

Next, as illustrated in FIG. 6A, a silicon substrate is prepared as the support 17, and a silicon oxide film or a silicon nitride film having a thickness of about 1 μm, for example, is formed as the etching stopper film 18 on the support 17.

Figure 6B:
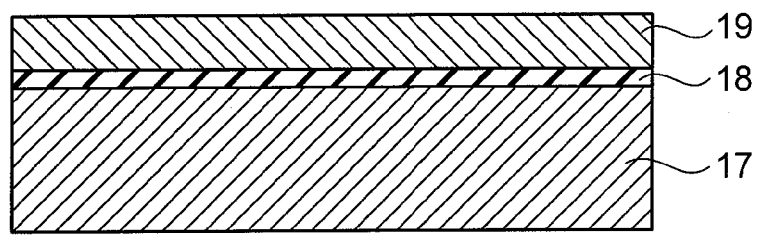

Subsequently, as illustrated in FIG. 6B, the scatterer film 19 is formed by depositing silicon on the etching stopper film 18 by the CVD method.

Figure 6C:
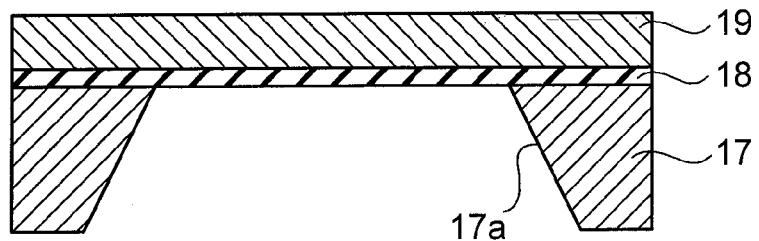

Next, as illustrated in FIG. 6C, the opening 17a is formed by selectively removing a portion of the support 17 corresponding to the opening 1a of the shield plate 1 by wet etching.

Figure 6D:
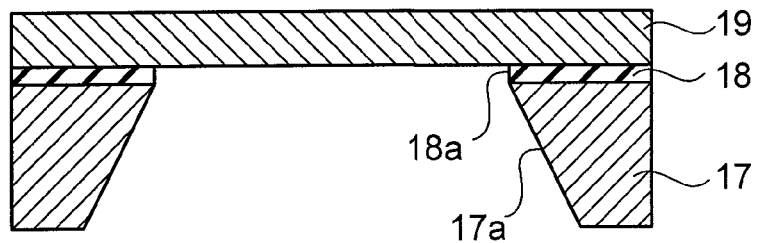

Thereafter, as illustrated in FIG. 6D, a portion of the etching stopper film 18 exposed through the opening 17a of the support 17 is selectively removed by wet etching or dry etching. By forming the etching stopper film 18 between the support 17 and the scatterer film 19 as described above, it is possible to prevent the scatterer film 19 from being etched during formation of the opening 17a in the support 17, and thereby to suppress a variation in thickness of the scatterer film 19.

Thus, formation of the scatterer 2 having the structure of FIG. 6D is finished.

Thereafter, the electron beam detector 10 illustrated in FIG. 4 is finished by fixing the shield plate 1 of FIG. 5D, the scatterer 2 of FIG. 6D, and the beam detection element 3 (see FIG. 4) to the container 71.

Second Embodiment

Figure 7:
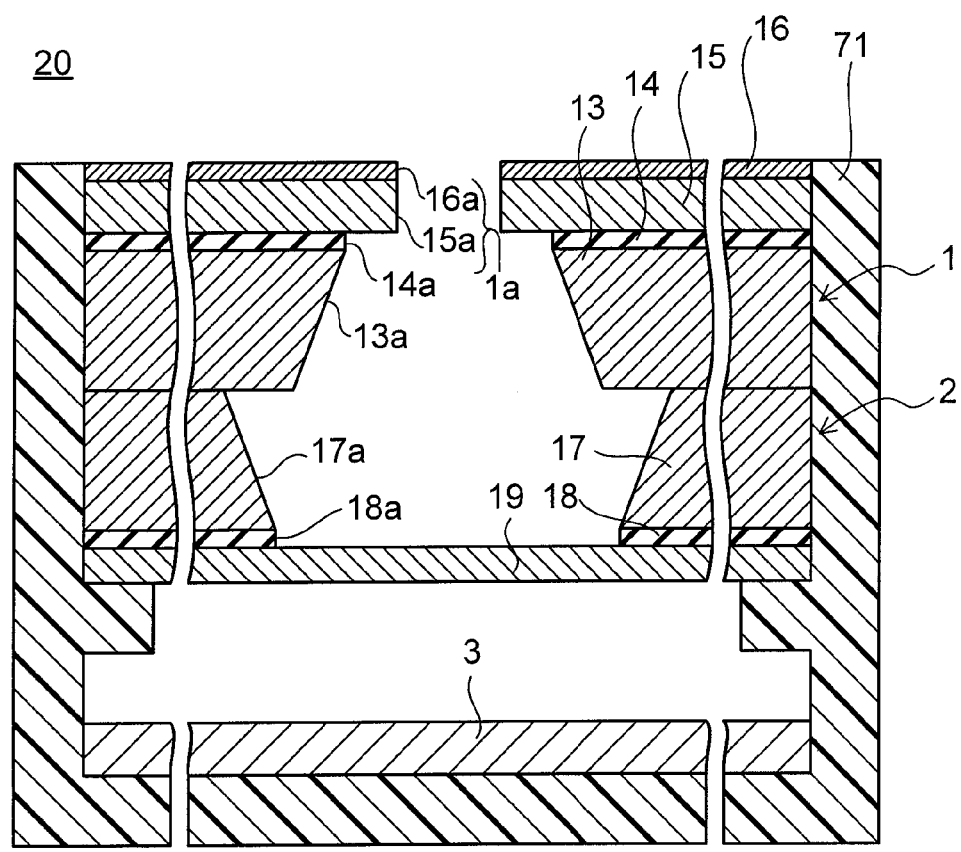
FIG. 7 is a cross-sectional view of an electron beam detector according to a second embodiment.

FIG. 7 is a cross-sectional view of an electron beam detector according to a second embodiment. Here, constituents of an electron beam detector 20 of this embodiment which are the same as those of the electron beam detector 10 of FIG. 4 will be denoted by the same reference numerals and description thereof will be omitted.

The electron beam detector 20 of this embodiment is different from the electron beam detector 10 illustrated in FIG. 4 in that the shield plate 1 and the scatterer 2 are integrated together in the electron beam detector 20.

As illustrated in FIG. 7, in the electron beam detector 20, the support 17 of the scatterer 2 is bonded to the first support 13 of the shield plate 1. The support 17 and the first support 13 are bonded with a direct bonding method in which surfaces of the support 17 and the first support 13 are activated by exposing the surfaces to hydrogen plasma, nitrogen plasma, oxygen plasma, or an argon ion beam, and then the surfaces are brought into contact with each other.

Since the shield plate 1 and the scatterer 2 are directly bonded to each other, the distance between the shield plate 1 and the scatterer 2 can be set more accurately in the electron beam detector 20 of this embodiment than in the electron beam detector 10 of FIG. 4.

Third Embodiment

Figure 8A:
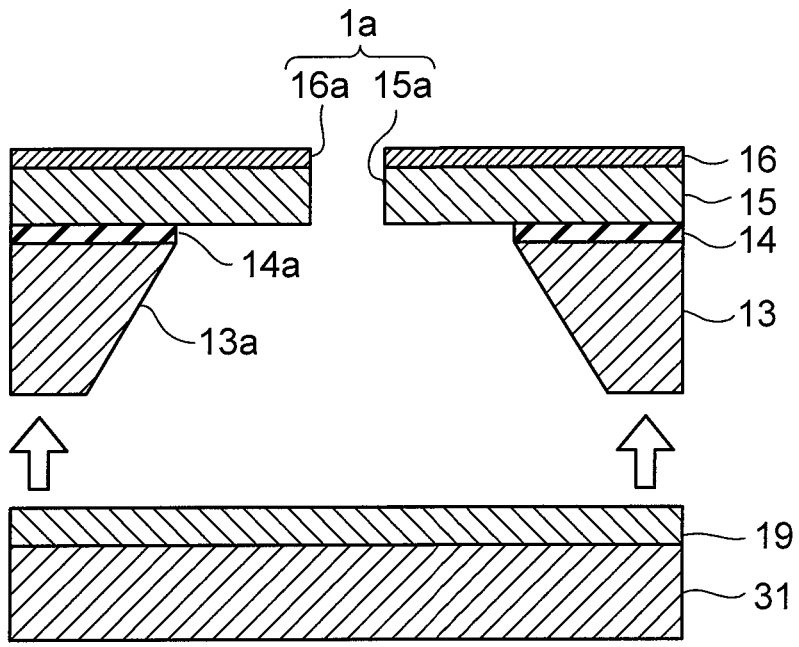
FIGS. 8A and 8B are cross-sectional views illustrating a method of manufacturing an electron beam detector according to a third embodiment.
Figure 8B:
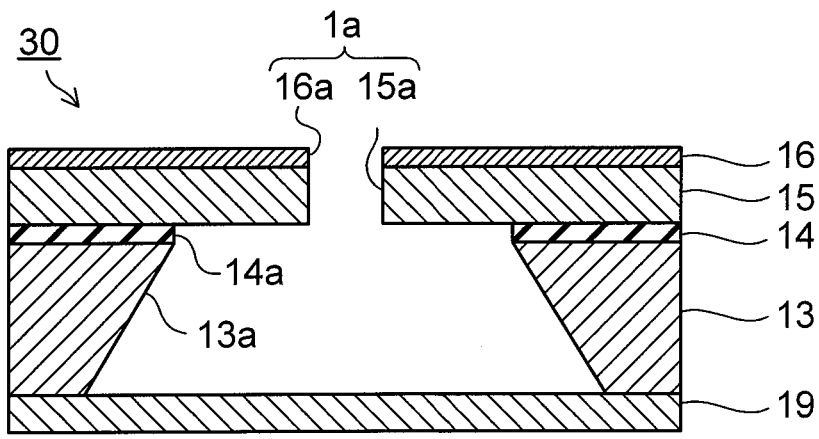

FIGS. 8A and 8B are cross-sectional views illustrating a method of manufacturing an electron beam detector 30 according to a third embodiment. Here, constituents of the electron beam detector of this embodiment which are the same as those of the electron beam detector 10 of FIG. 4 will be denoted by the same reference numerals and description thereof will be omitted.

As illustrated in FIG. 8B, the shield plate 1 and the scatterer 2 are bonded and integrated together with the direct bonding method in the electron beam detector 30 of this embodiment. Here, the scatterer film 19 is directly bonded to the first support 13 of the shield plate 1, whereby the first support 13 also functions as a support for the scatterer film 19.

The electron beam detector 30 illustrated in FIG. 8B is manufactured as described below.

First, the shield plate 1 having the structure illustrated in FIG. 8A is prepared. This shield plate 1 may be manufactured with the method illustrated in FIGS. 5A to 5D. Next, a substrate 31 provided with the scatterer film 19 on its upper surface is prepared. Here, the substrate 31 is formed by use of a material different from the material constituting the scatterer film 19.

Next, the scatterer film 19 is bonded to the first support 13 of the shield plate 1 as indicated with arrows in FIG. 8A.

Then, the substrate 31 is selectively removed by a method such as wet etching while the scatterer film 19 bonded to the first support 13 is left unremoved. Thus, the electron beam detector 30 illustrated in FIG. 8B is obtained.

The shield plate 1 is bonded to the scatterer film 19 in this embodiment as well. Hence, it is possible to accurately set the distance between the shield film 16 and the scatterer film 19.

Fourth Embodiment

Figure 9:
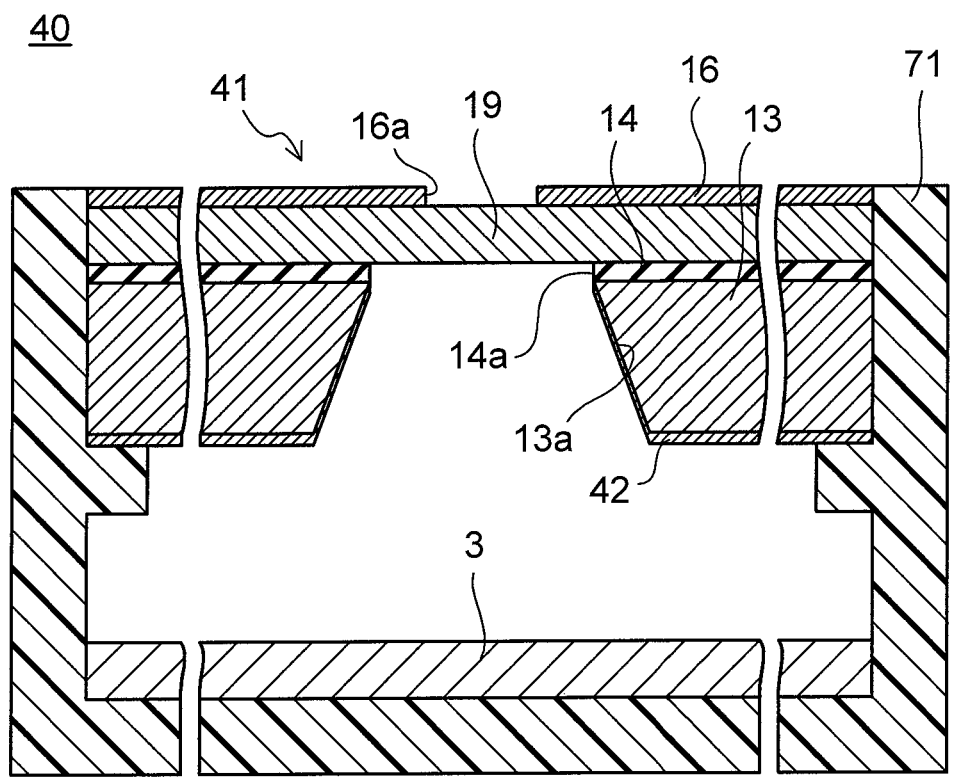
FIG. 9 is a cross-sectional view illustrating an electron beam detector according to a fourth embodiment.

FIG. 9 is a cross-sectional view of an electron beam detector according to a fourth embodiment. Here, constituents of an electron beam detector 40 of this embodiment which are the same as those of the electron beam detector 10 of FIG. 4 will be denoted by the same reference numerals and description thereof will be omitted.

As illustrated in FIG. 9, in the electron beam detector 40 of this embodiment, the scatterer film 19 is disposed immediately below the shield film 16. Thus, in the electron beam detector 40, the shield film 16 and the scatterer film 19 are arranged at a close distance. For this reason, an intensity of the electron beam passed through the opening 16a of the shield film 16 and the scatterer film 19 is influenced more significantly by the shape of the electron beam EB.

As a consequence, the electron beam detector 40 of this embodiment is suitable for measurement of the shape of the electron beam EB.

FIGS. 10A to 10D are cross-sectional views illustrating a method of manufacturing the electron beam detector 40 of FIG. 9.

Figure 10A:
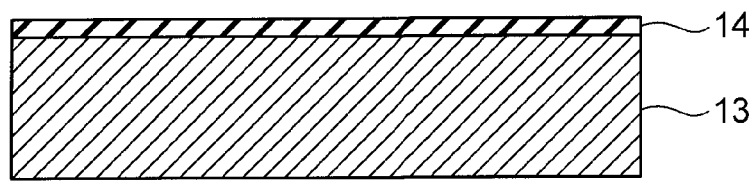
FIGS. 10A to 10D are cross-sectional views illustrating a method of manufacturing the electron beam detector of FIG. 9, which are illustrated in the order of processes

First, as illustrated in FIG. 10A, a silicon substrate is prepared as the first support 13. Then, the etching stopper film 14 made of silicon oxide, for example, is formed on the first support 13.

Figure 10B:
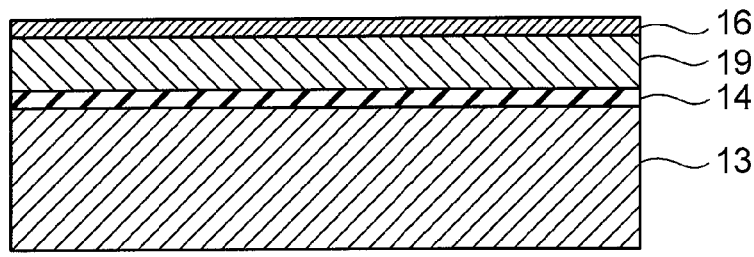

Next, as illustrated in FIG. 10B, a silicon film having a thickness of about 2 μm is formed as the scatterer film 19 on the etching stopper film 14 by the CVD method, for example.

In the case of using the commercially available SOI substrate, the processes of forming the etching stopper film 14 and the scatterer film 19 can be omitted.

Thereafter, a platinum (Pt) film having a thickness of several tens of nanometers, for example, is formed as the shield film 16 on the scatterer film 19.

Figure 10C:
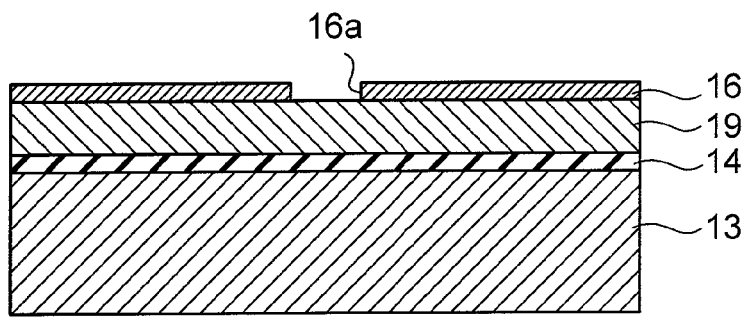

Next, as illustrated in FIG. 10C, a portion of the shield film 16 is selectively removed by dry etching, whereby the opening 16a is formed to expose the scatterer film 19 therethrough at its bottom part.

Figure 10D:
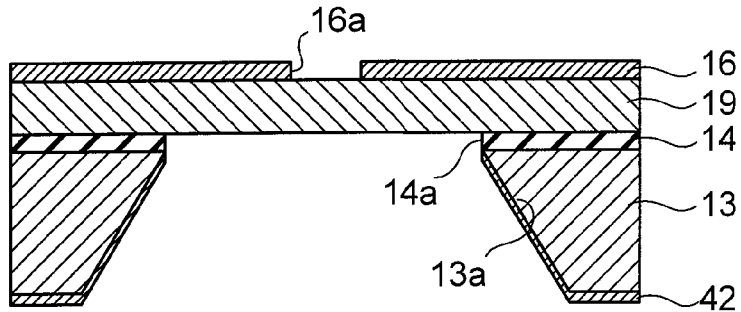

Then, as illustrated in FIG. 10D, the opening 13a is formed in the first support 13 by removing a portion of the first support 13 around the opening 16a by wet etching. Subsequently, the opening 14a is formed in the etching stopper film 14 by removing a portion of the etching stopper film 14 exposed through the opening 13a.

Next, a metal film 42 made of platinum or the like is formed on a lower surface of the first support 13 and at the side walls of the opening 13a of the first support 13. Thus, a scatterer 41 illustrated in FIG. 10D is finished.

Thereafter, formation of the electron beam detector 40 of this embodiment is finished by fixing the scatterer 41 as well as the beam detection element 3 to the container 71 as illustrated in FIG. 9.

Fifth Embodiment

Figure 11:
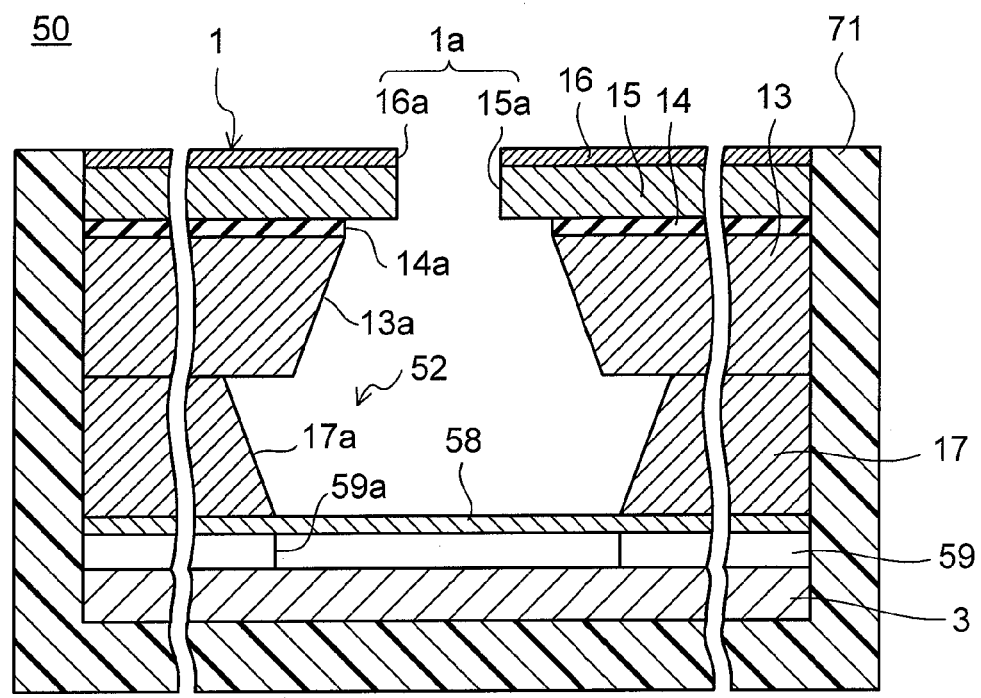
FIG. 11 is a cross-sectional view illustrating an electron beam detector according to a fifth embodiment.

FIG. 11 is a cross-sectional view illustrating an electron beam detector according to a fifth embodiment. Here, constituents of an electron beam detector 50 of this embodiment which are the same as those of the electron beam detector 20 illustrated in FIG. 7 will be denoted by the same reference numerals and description thereof will be omitted.

As illustrated in FIG. 11, in the electron beam detector 50, a scatterer 52 including a scatterer film 58 is bonded to the beam detection element 3 while a thin spacer film 59 in a thickness of several tens to several hundreds of nanometers is interposed in between. In this embodiment, the beam detection element 3 is separated from the scatterer film 58 by way of the spacer film 59. Accordingly, it is possible to integrate the beam detection element 3 and the scatterer film 58 together while avoiding an influence of heat generation of the scatterer film 58 attributed to irradiation with the electron beam EB.

In addition, the spacer film 59 is formed by using a semiconductor process. Accordingly, the distance between the beam detection element 3 and the scatterer film 58 can be controlled at high accuracy. Thus, it is possible to effectively suppress a variation in detection accuracy of the electron beam.

A method of manufacturing the electron beam detector 50 illustrated in FIG. 11 will be described below.

Figure 12A:
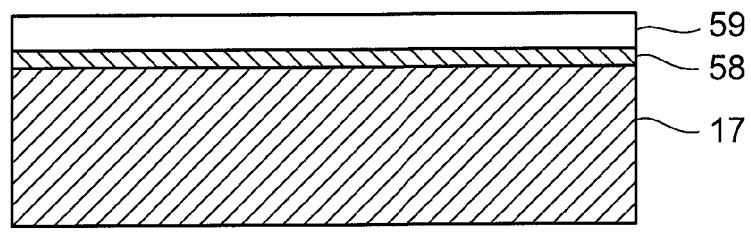
FIGS. 12A to 12D are a first group of cross-sectional views illustrating a method of manufacturing the electron beam detector of FIG. 11, which are illustrated in the order of processes.
Figure 12B:
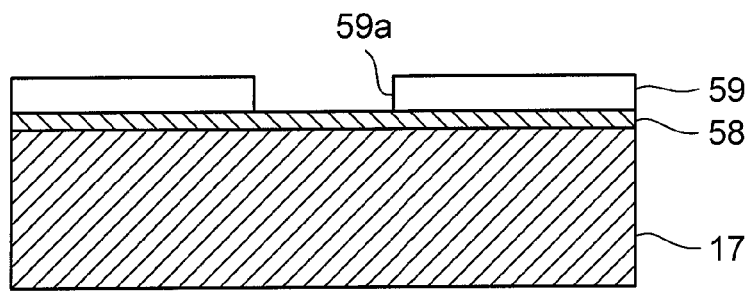
Figure 12C:
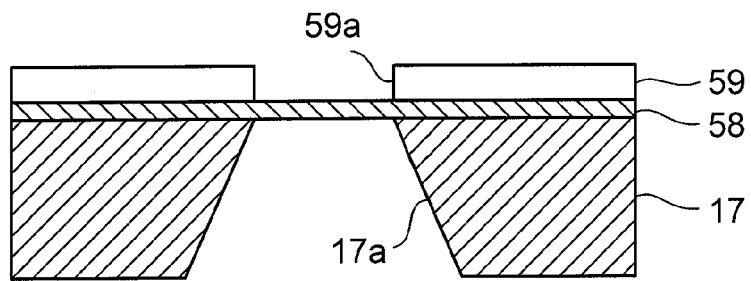
Figure 12D:
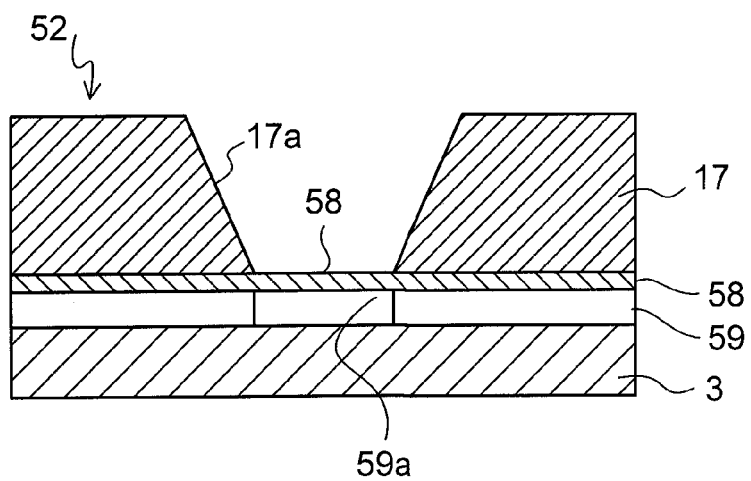
Figure 13:
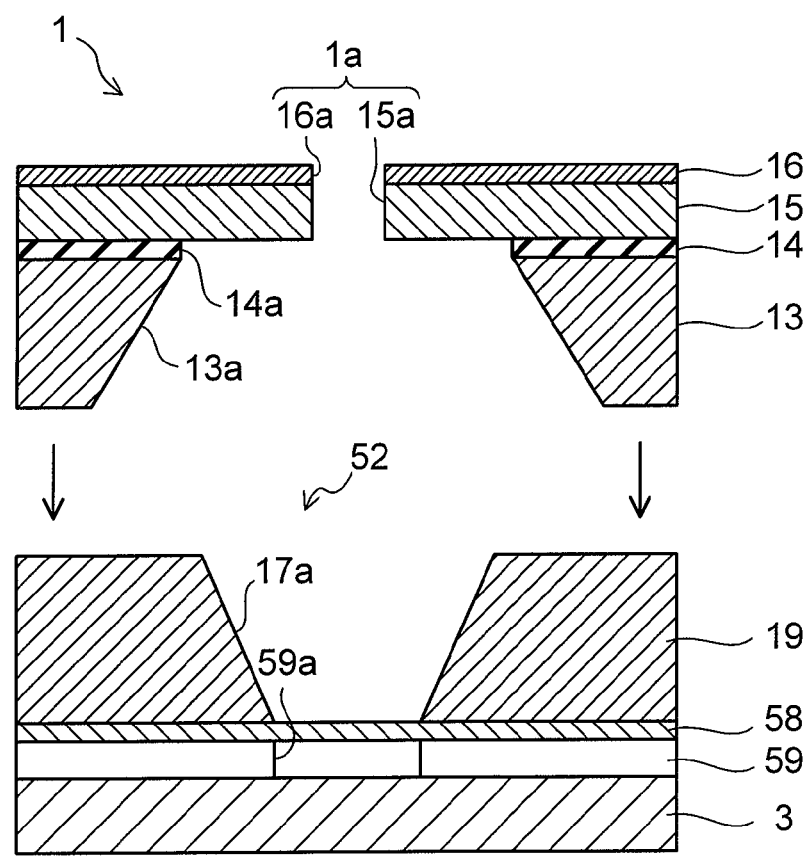
FIG. 13 is a second group of a cross-sectional view illustrating the method of manufacturing the electron beam detector of FIG. 11.

FIGS. 12A to 13 are cross-sectional views illustrating the method of manufacturing the electron beam detector 50 of FIG. 11.

As illustrated in FIG. 12A, a silicon substrate is prepared as the support 17, and the scatterer film 58 made of a different material from that of the support 17 is formed on the support 17. In this case, a silicon nitride film having a thickness of about 2 μm is formed as the scatterer film 58 by the CVD method, for example.

Next, the spacer film 59 is formed on the scatterer film 58 by depositing silicon in a thickness from about 50 nm to 500 nm, for example, by the CVD method, for example. The material of the spacer film 59 is not limited only to silicon, and an appropriate material different from the material of the scatterer film 58 may be used instead.

Subsequently, as illustrated in FIG. 12B, a portion of the spacer film 59 is selectively removed by dry etching, whereby an opening 59a is formed to expose the scatterer film 58 therethrough at its bottom part. This opening 59a is formed at a portion corresponding to the opening 1a of the shield plate 1.

Next, as illustrated in FIG. 12C, a portion of the support 17 below the opening 59a and corresponding to the opening 59a is removed by wet etching, whereby the opening 17a is formed to expose the scatterer film 58 therethrough.

Then, as illustrated in FIG. 12D, a surface of the beam detection element 3 and a surface of the spacer film 59 are activated by exposing the surfaces to hydrogen plasma, argon ions or the like, and then the surfaces are pressure bonded to each other.

Thus, the beam detection element 3 and the scatterer 52 are integrally bonded to each other.

Subsequently, the shield plate 1 (see FIG. 13) manufactured by the method described with reference to FIGS. 5A to 5D is prepared.

Then, as illustrated in FIG. 13, the first support 13 of the shield plate 1 and the support 17 of the scatterer 52 are bonded to each other with the direct bonding method. Thus, the shield plate 1, the scatterer 52, and the beam detection element 3 are integrally bonded together.

Thereafter, the electron beam detector 50 illustrated in FIG. 11 is finished by fixing the shield plate 1, the scatterer 52, and the beam detection element 3 bonded by the method of FIG. 13 into the container 71.

As described above, the spacer film 59 is formed by use of the semiconductor process in this embodiment. Thus, the distance between the beam detection element 3 and the scatterer film 58 can be controlled at high accuracy, and the electron beam detector 50 with less variation in detection accuracy of the electron beam is obtained as a consequence.

In the electron beam detector 50 of this embodiment, an etching stopper film may be formed between the scatterer film 58 and the support 17. Thus, it is possible to suppress reduction in thickness of the scatterer film 58 during formation of the opening 17a in the support 17, and thereby to suppress a variation in thickness of the scatterer film 58.

Sixth Embodiment

Figure 14:
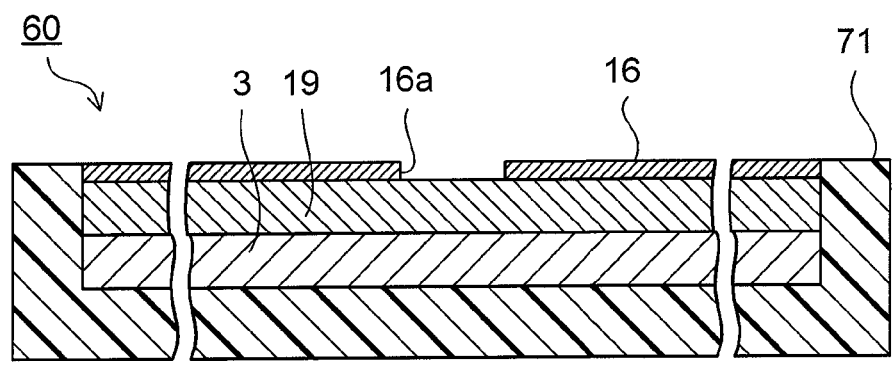
FIG. 14 is a cross-sectional view illustrating an electron beam detector according to a sixth embodiment.

FIG. 14 is a cross-sectional view illustrating an electron beam detector according to a sixth embodiment.

As illustrated in FIG. 14, in an electron beam detector 60 of this embodiment, the scatterer film 19 is formed on the beam detection element 3 and the shield film 16 including the opening 16a formed therein is formed on the scatterer film 19.

The scatterer film 19 is a silicon film having a thickness of 2 μm, for example, which is formed on the beam detection element 3 such as the PIN diode by the CVD method or the like.

Meanwhile, the shield film 16 is a platinum film, for example, which is formed on the scatterer film 19 by a sputtering method or the like.

This embodiment has a simple structure since the beam detection element 3, the scatterer film 19, and the shield film 16 are integrally formed. Thus, the electron beam detector 60 can be formed with a fewer number of processes. In addition, the beam detection element 3, the scatterer film 19, and the shield film 16 are arranged at equal distances with respect to one another. Hence, it is possible to suppress a variation in detection sensitivity depending on the position.

What is claimed is:

1. An electron beam detector comprising:
  a shield plate having a plurality of openings including a support of the shield plate formed into flat plate shape and a shield film supported by the support of the shield plate;
  a scatterer arranged in parallel with the shield plate, including a support of the scatterer formed into flat plate shape which includes a plurality of openings formed at portions corresponding to the plurality of openings of the shield plate, and a scatterer film formed on the support of the scatterer and configured to scatter electron beam passed through the shield plate; and
  a beam detection element formed into flat plate shape and arranged in parallel with the shield plate, disposed at a predetermined distance from the scatterer and configured to convert the electron beam passed through the scatterer into an electric signal.

2. The electron beam detector according to claim 1, wherein an etching stopper film is formed between the scatterer film and the support of the scatterer by use of a material different from that of the scatterer film and that of the support member.

3. The electron beam detector according to claim 1, wherein the scatterer film and the support of the scatterer are made of different materials.

4. The electron beam detector comprising:
  a shield plate having a plurality of openings including:
    a first support formed into flat plate shape;
    a second support formed on the first support; and
    a shield film formed on the second support, which is supported by the first support and the second support having a plurality of openings,
  a scatterer, arranged in parallel with the shield plate, including:
    a support of the scatterer formed into flat plate shape which includes a plurality of openings formed at portions corresponding to the plurality of openings of the shield plate; and
    a scatterer film formed on the support of the scatterer and configured to scatter electron beam passed through the shield plate; and
  a beam detection element formed into flat plate shape and arranged in parallel with the shield plate, disposed at a predetermined distance from the scatterer and configured to convert the electron beam passed through the scatterer into an electric signal,
  wherein the support of the scatterer and the first support of the shield plate are integrally bonded to each other.

5. The electron beam detector according to claim 1, wherein
  the scatterer comprises a spacer film formed on the scatterer film and including an opening formed at the same position as the opening of the support of the scatterer, and
  the scatterer and the beam detection element are bonded to each other while the spacer film is interposed in between.

6. The electron beam detector comprising:
  a shield plate having a plurality of openings including a support of the shield plate formed into flat plate shape, and a shield film supported by the support of the shield plate;
  a scatterer, arranged in parallel with the shield plate, including a scatterer film formed on the support of shield plate and configured to scatter electron beam passed through the shield plate; and
  a beam detection element formed into flat plate shape and arranged in parallel with the shield plate, disposed at a predetermined distance from the scatterer and configured to convert the electron beam passed through the scatterer into an electric signal,
  wherein the shield film is formed on the scatterer film.

7. The electron beam detector according to claim 6, wherein the support of the shield plate is covered with a metal film.

8. The electron beam detector according to claim 1, wherein the beam detection element is a PIN diode formed into the same shape as the scatterer.

9. The electron beam detector comprising:
  a shield plate including a plurality of openings formed therein;
  a scatterer disposed at a predetermined distance from the shield plate and configured to scatter an electron beam passed through any of the openings of the shield plate; and
  a beam detection element disposed at a predetermined distance from the scatterer and configured to convert the electron beam passed through the scatterer into an electric signal;
  wherein a scatterer film constituting the scatterer is formed on the beam detection element, and
  wherein a shield film constituting the shield plate and including an opening formed in its predetermined portion is formed on the scatterer film.

10. An electron beam processing apparatus comprising:
  an electron beam irradiator configured to perform irradiation with an electron beam;
  a sample stage to mount a sample to be irradiated with the electron beam; and
  an electron beam detector placed on the sample stage and configured to detect a characteristic of the electron beam, wherein
  the electron beam detector includes:
    a shield plate having a plurality of openings including a support of the shield plate formed into flat plate shape, and a shield film supported by the support of the shield plate;
    a scatterer, arranged in parallel with the shield plate, including a support of the scatterer formed into flat plate shape which includes a plurality of openings formed at portions corresponding to the plurality of openings of the shield plate, and a scatterer film formed on the support of the scatterer and configured to scatter electron beam passed through the shield plate; and
    a beam detection element formed into flat plate shape and arranged in parallel with the shield plate, disposed at a predetermined distance from the scatterer and configured to convert the electron beam passed through the scatterer into an electric signal.

11. A method of manufacturing an electron beam detector comprising the steps of:
  preparing a support;

forming an etching stopper film on the support, the etching stopper film being made of a material different from a material of the support;

forming a scatterer film on the etching stopper film, the scatterer film being made of a material different from the material of the etching stopper film;

forming an opening in a predetermined portion of the support by etching; and removing selectively the etching stopper film exposed through the opening of the support, wherein the electron beam detector includes:

a shield plate having a plurality of openings including a support of the shield plate formed into flat plate shape, and a shield film supported by the support of the shield plate;

a scatterer, arranged in parallel with the shield plate, including a support of the scatterer formed into flat plate shape which includes a plurality of openings formed at portions corresponding to the plurality of openings of the shield plate, and a scatterer film formed on the support of the scatterer and configured to scatter electron beam passed through the shield plate; and a beam detection element formed into flat plate shape and arranged in parallel with the shield plate, disposed at a predetermined distance from the scatterer and configured to convert the electron beam passed through the scatterer into an electric signal.

12. The electron beam detector according to claim 1, wherein the scatterer is arranged in such a direction that the support of the scatterer is located on an upstream side of the electron beam.

13. An electron beam detector according:

a shield plate having a plurality of openings and including a first support formed into flat plate shape and a shield film which is supported by the first support having a plurality of openings;

a scatterer film arranged in parallel with the shield plate, integrally bonded to bottom surface of the first support and configured to scatter the electron beam passed through the shield plate; and a beam detection element formed into flat plate shape arranged in parallel with the shield plate disposed at a predetermined distance from the scatterer and configured to convert the electron beam passed through the scatterer into an electric signal.

\* \* \* \* \*